(12) United States Patent
Twynam

(10) Patent No.: US 6,566,694 B2
(45) Date of Patent: May 20, 2003

(54) HETEROJUNCTION BIPOLAR TRANSFERRED ELECTRON TETRODE

(75) Inventor: John Kevin Twynam, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 23 days.

(21) Appl. No.: 09/820,767

(22) Filed: Mar. 30, 2001

(65) Prior Publication Data

US 2002/0011605 A1 Jan. 31, 2002

(30) Foreign Application Priority Data

Mar. 30, 2000 (JP) ........................................ 2000-094304

(51) Int. Cl.[7] ........................ H01L 29/06; H01L 33/00; H01L 31/109; H01L 29/765; H01L 31/0336
(52) U.S. Cl. ........................ 257/197; 257/12; 257/26; 257/27; 257/29; 257/94; 257/96; 257/183; 257/183.1; 257/197; 257/912
(58) Field of Search ........................ 257/197, 26, 27, 257/29, 912, 96, 12, 94, 183, 183.1

(56) References Cited

U.S. PATENT DOCUMENTS

| | | | | |
|---|---|---|---|---|
| 5,352,911 A | * | 10/1994 | Grossman | 257/198 |
| 5,365,477 A | * | 11/1994 | Cooper et al. | 257/110 |
| 5,404,373 A | * | 4/1995 | Cheng | 372/50 |
| 5,408,107 A | * | 4/1995 | Neikirk et al. | 257/28 |
| 5,648,666 A | * | 7/1997 | Tran et al. | 257/197 |
| 5,677,552 A | * | 10/1997 | Ogura | 257/113 |
| 5,789,301 A | * | 8/1998 | Hill | 148/DIG. 51 |
| 5,798,535 A | * | 8/1998 | Huang et al. | 257/83 |
| 5,888,859 A | * | 3/1999 | Oku et al. | 257/29.041 |
| 5,946,438 A | * | 8/1999 | Minot et al. | 257/80 |
| 6,133,594 A | * | 10/2000 | Iwai et al. | 166/187 |
| 6,229,189 B1 | * | 5/2001 | Yap et al. | 257/414 |

OTHER PUBLICATIONS

Twynam, J.K., et al., "Demonstration of a 77–GHz Heterojunction Bipolar Transferred Election Device", IEEE Electron Device Letters, vol. 21, No. 1, Jan. 2000.

Posse, V.A., et al., "Transferred–electron induced current instabilites in heterojunction bipolar transistors", Appl. Phys. Lett. 66 (24), Jun. 12, 1995.

* cited by examiner

Primary Examiner—Amir Zarabian
Assistant Examiner—Ida M. Soward
(74) Attorney, Agent, or Firm—Birch, Stewart, Kolasch & Birch, LLP

(57) ABSTRACT

A heterojunction bipolar transferred electron tetrode has an anode region providing a first terminal, an active region in which Gunn-Hilsum oscillations are generated, a base region providing a second terminal, a cathode region providing a third terminal, and a fourth terminal which is operable independently of the three terminals. The fourth terminal can take the form of a second cathode-type structure, a second base region or a Schottky gate electrode. The cathode region and fourth terminal are in proximity enough to each other such that one of the cathode region and the fourth terminal is usable as an input terminal and that the other of the cathode region and the fourth terminal is usable as a terminal to which an electrical signal for disturbing an electric field profile or a current density in the active region is applied.

13 Claims, 12 Drawing Sheets

HETEROJUNCTION BIPOLAR TRANSFERRED ELECTRON TETRODE

BACKGROUND OF THE INVENTION

The present invention relates to a heterojunction bipolar transferred electron tetrode. The heterojunction bipolar transferred electron tetrode is an improvement of a known heterojunction bipolar transferred electron triode having three terminals of the cathode, base and anode, and further has a separate fourth terminal that operates independently of the three terminals.

A heterojunction bipolar transferred electron triode is a three-terminal device in which high-frequency Gunn-Hilsum oscillations are generated ("Transferred electron induced current instabilities in heterojunction bipolar transistors", V. A. Posse, B. Jalali and A. F. J. Levi, Appl. Phys. Lett. 66 (24), Jun. 12, 1995). The device has a structure somewhat similar to a conventional npn heterojunction bipolar transistor, although the mechanism of its operation is completely different and a very specific design must be employed for the active region of the device (corresponding to the collector region of the bipolar transistor) to achieve device operation ("Demonstration of a 77-GHz Heterojunction Bipolar Transferred Electron Device", J. K. Twynam, M. Yagura, N. Takahashi, E. Suematsu and H. Sato, IEEE Electron Device Lett., 21 (1), 2000).

A heterojunction bipolar transferred electron triode can operate as a self-oscillating mixer of a high-frequency receiver. For example, in the down converter mode the RF (radio-frequency) signal is input into the cathode, the base is grounded and the IF (intermediate frequency) output signal, which is obtained as a result of mixing of the RF signal and the LO (local oscillation) signal generated by Gunn-Hilsum oscillations in the active layer, is extracted from the anode. In this free-running mode of operation the LO frequency of the device is not accurately defined and is dependent on the device structure and the external circuit impedances. This presents a problem because a small percentage error in the LO signal frequency gives a large percentage error in the down-converted IF signal frequency. For example, if the RF signal frequency is 100 GHz and the LO frequency is 102 GHz ±2 GHz, then the down-converted IF signal frequency will be 2 GHz±2 GHz. Such a large margin of error in the IF signal frequency is not acceptable. An additional problem is that, like most oscillators, the phase noise of the LO signal is generally rather poor under free-running conditions.

The stability of the IF output signal depends directly on the stability of the LO signal. In a free-running device, however, the stability of the LO signal is usually insufficient. In order to stabilize the fundamental frequency of the LO signal at the desired value and decrease the phase noise, the technique of injection locking can be employed. In this technique a stable sub-harmonic signal is injected into the cathode, along with the RF signal. The injection locking signal power is generally much greater than the RF signal power and this can lead to the problem of unwanted transmission of the injection locking signal from the receiver antenna. This is illustrated by the circuit block diagram shown in FIG. 8. Reference numeral 801 in FIG. 8 indicates the heterojunction bipolar transferred electron triode. The transmission of the locking signal from the receiver antenna is undesirable because it can interfere with other receivers.

SUMMARY OF THE INVENTION

An object of the present invention is to provide a noble device that can solve the above problems, by improving the heterojunction bipolar transferred electron triode.

In order to accomplish the above object, the present invention provides a heterojunction bipolar transferred electron tetrode comprising:

an anode region providing a first terminal as an output terminal;

an active region in which Gunn-Hilsum oscillations are generated;

a base region providing a second terminal;

a cathode region providing a third terminal;

the anode region, active region, base region, and cathode region being provided sequentially, and a fourth terminal which is operable independently of each of the three terminals, and wherein the cathode region and fourth terminal are in proximity enough to each other such that one of these two terminals is usable as an input terminal and the other of these two terminals is usable as a terminal to which an electrical signal for disturbing an electric field profile or a current density in the active region is applied.

The heterojunction bipolar transferred electron tetrode of this invention has the fourth terminal which operates independently of the existing three terminals of the anode, base and cathode. This allows an injection-locking signal to be injected into a different terminal (namely, the fourth terminal or the cathode terminal) from the terminal (namely, the cathode terminal or the fourth terminal) into which the RF (or IF) signal is input, leading to good isolation between the two terminals when the heterojunction bipolar transferred electron tetrode of this invention is used as a self-oscillating mixer. Thus, the injection-locking signal is prevented from being transmitted from a receiver antenna when the receiver contains the heterojunction bipolar transferred electron tetrode down converter. Further, the electrical signal applied to the fourth terminal or the cathode terminal (third terminal) has the effect of disturbing the electric field profile or the current density in the active layer so that a sub-harmonic locking signal applied to the fourth terminal or the cathode region can be used to stabilize the Gunn oscillation (LO) signal frequency.

When the heterojunction bipolar transferred electron triode is used as a self-oscillating mixer, the LO signal is generated by Gunn-Hilsum oscillations in the active layer and the signal appears between the first terminal (anode terminal) and the second terminal (base terminal) (which is usually ground). The power of these LO oscillations is dependent on the electric field profile and the current density in the active layer, both of which are time-dependent and position-dependent. The LO signal power is dependent, therefore, on the cathode current since this affects the current density in the active layer. Since this dependence is non-linear, an RF (or IF) signal input into the cathode (third terminal) or the fourth terminal is mixed with the LO signal and the resulting IF (or RF) signal is obtained, along with the LO signal, at the output (first terminal).

The fourth terminal can take the form of a second cathode-type structure, a second base region, or a Schottky barrier gate electrode.

A minimum distance between the fourth terminal and the cathode region in a direction parallel to a plane of the interface between the base region and the active region may be less than twice a thickness of the active region in a direction perpendicular to the plane, in view of an angle at which an electron current flux spreads in the active region.

The anode region, active region, and cathode region may be made of n-type semiconductors and the base region may be made of a p-type semiconductor.

In one embodiment, the fourth terminal is constituted of a second cathode region. Each cathode region is located adjacent to the base region and has its own independent electrode. The cathode regions, base region, active region and anode region are formed of III–V semiconductor compounds containing one or more of group III elements of Ga, In or Al and one or more of group V elements of As, P or N, and the active region has a doping concentration that decreases with increasing distance from the base region. When this device is used as a self-oscillating mixer, an RF (IF) signal will be input into one of the two cathode terminals and a locking signal will be input into the other cathode terminal. This device may have additional cathode regions.

In another embodiment, the fourth terminal is constituted of a second base region. Each base region is located adjacent to the active region and has its own independent electrode. The cathode region, base regions, active region and anode region are formed of III–V semiconductor compounds containing one or more of group III elements of Ga, In and Al and one or more of group V elements of As, P and N, and the active region has a doping concentration that decreases with increasing distance from the base region. When this device is used as a self-oscillating mixer either an RF (IF) signal will be input into the cathode terminal and a locking signal input into the second base terminal, or an RF (IF) signal will be input into the second base terminal and a locking signal input into the cathode terminal. This device may have additional base regions and cathode regions which each have their own electrodes.

In still another embodiment, the fourth terminal is constituted of a Schottky barrier gate electrode formed on the active layer. The cathode region, base region, active region and anode region are formed of III–V semiconductor compounds containing one or more of group III elements of Ga, In and Al and one or more of group V elements of As, P and N, and the active region has a doping concentration that decreases with increasing distance from the base region. When this device is used as a self-oscillating mixer either an RF (IF) signal will be input into the cathode terminal and a locking signal input into the Schottky barrier gate electrode, or an RF (IF) signal will be input into the Schottky barrier gate electrode and a locking signal input into the cathode terminal. This device may have additional cathode regions, Schottky barrier gate electrodes and base regions.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 2:
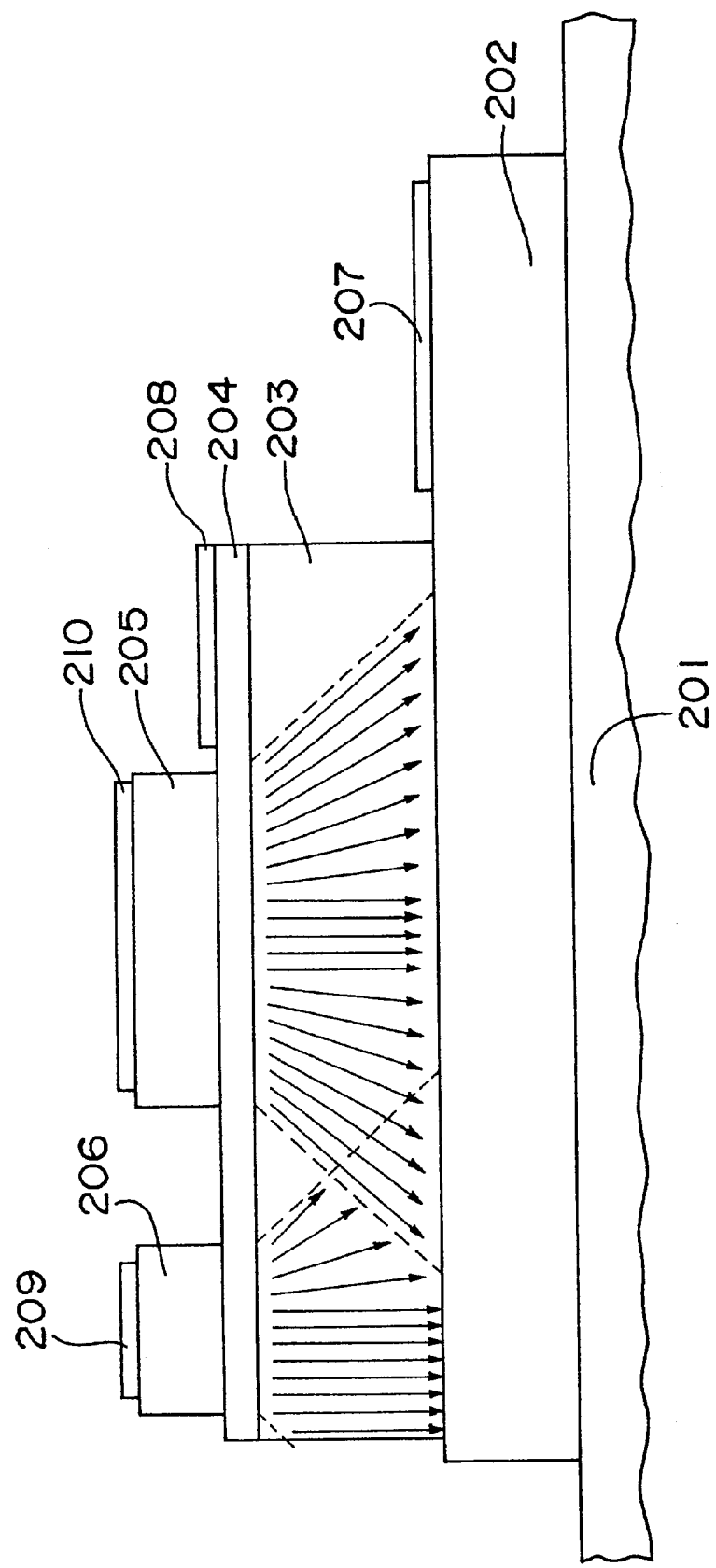
FIG. 2 shows a simplified schematic cross-section of the first embodiment.

FIG. 2 shows a simplified schematic cross-section of a first embodiment of the heterojunction bipolar transferred electron tetrode of the invention.

The heterojunction bipolar transferred electron tetrode has a semi-insulating semiconductor substrate 201, an n-type semiconductor anode layer (anode region) 202, an n-type semiconductor active layer (active region) 203, a p-type semiconductor base layer (base region) 204, and n-type semiconductor first and second cathodes (cathode regions) 205 and 206, the layers 202–205 being sequentially stacked on the substrate 201. The active layer 203 covers a part of a top surface of the anode layer 202 and the base layer 204 covers an entire top surface of the active layer 203. The first and second cathodes 205 and 206 located on a top surface of the base layer 204 are separated from each other but in close proximity to each other. An anode ohmic contact metal electrode 207 is provided on the top surface of the anode layer 202 in a position spaced from the active layer 203, while a base ohmic contact metal electrode 208 is provided on the top surface of the base layer 204 in a position spaced from the cathodes 205 and 206. Also, a first cathode ohmic contact metal electrode 210 and a second cathode ohmic contact metal electrode 209 are provided on the first cathode 205 and the second cathode 206, respectively, covering the greater part of their respective top surfaces.

In this embodiment, the fourth terminal has a second cathode-type structure located adjacent to the base layer 204 and in close proximity to the first cathode 205. If the two cathodes 205 and 206 are in close enough proximity, a sub-harmonic locking signal applied to the second cathode 206 has the effect of stabilizing the Gunn oscillation (LO) signal frequency. The arrows in the figure indicate the direction of flow of the electron flux. Since the electron current flux spreads out at an angle of approximately 40 degrees, as indicated in the figure, the lateral separation distance of the two cathodes 205 and 206 should be less than twice the thickness of the active layer 203.

When the heterojunction bipolar transferred electron tetrode is used as a self-oscillating mixer in a receiver or transmitter, an input RF or IF signal is input into the first cathode 205 through the first cathode ohmic contact metal electrode 210 while the locking signal is input into the second cathode 206 through the second cathode ohmic contact metal electrode 209. These cathodes 205 and 206 are electrically well isolated from each other. Thus, the locking signal is prevented from being transmitted from an antenna of the receiver or transmitter in which the heterojunction bipolar transferred electron tetrode is included. In addition, because the lateral separation distance between the two cathodes 205 and 206 is less than twice the thickness of the active layer 203, the injection locking signal well achieves the function of disturbing the electric field profile and the current density in the active layer 203. Thus, the Gunn oscillation (LO) signal frequency is effectively stabilized.

In the first embodiment, more than two cathodes having their own electrodes may be disposed adjacent to the base region.

Figure 3:
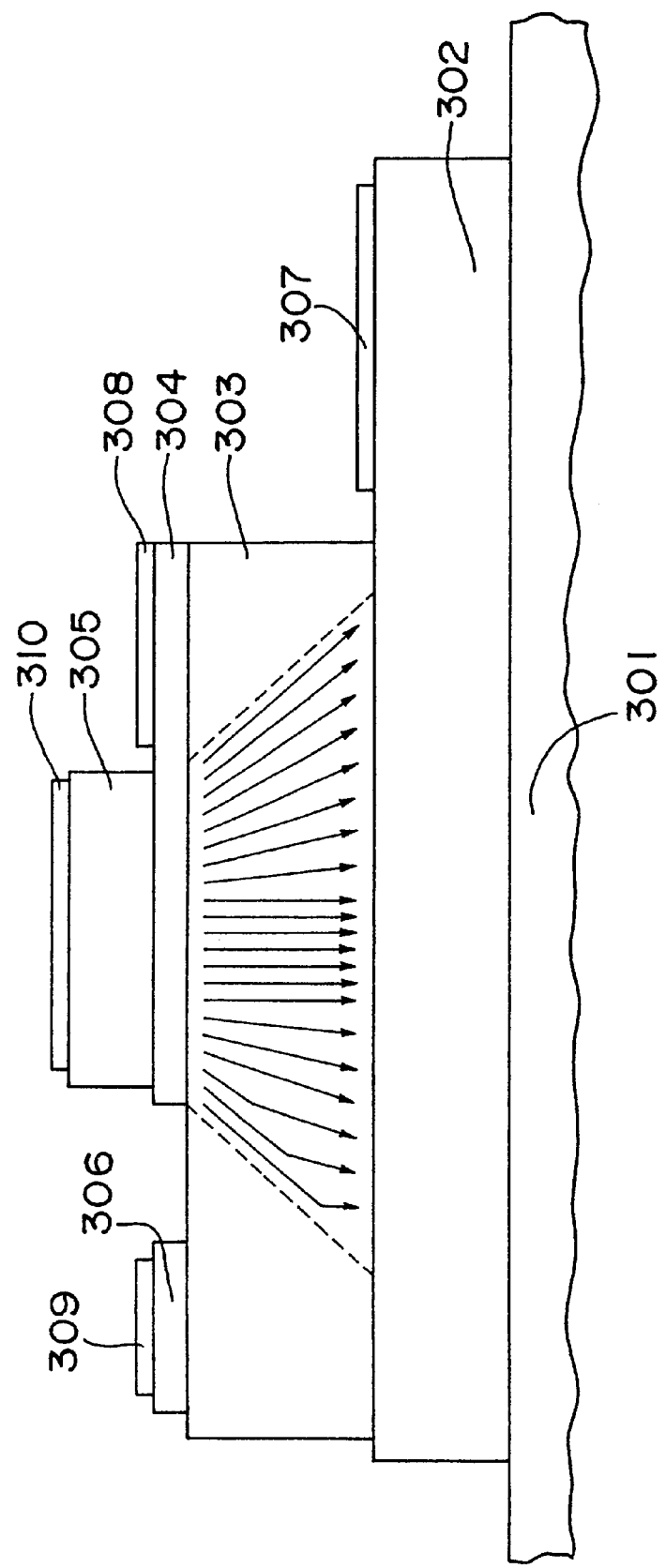
FIG. 3 shows a simplified schematic cross-section of a second embodiment of the heterojunction bipolar transferred electron tetrode of the invention.

FIG. 3 shows a simplified schematic cross-section of a second embodiment of the heterojunction bipolar transferred electron tetrode of the invention. The heterojunction bipolar transferred electron tetrode has a semi-insulating semiconductor substrate 301, an n-type semiconductor anode layer (anode region) 302, an n-type semiconductor active layer (active region) 303, p-type semiconductor first and second base layers (base regions) 304 and 306, and an n-type semiconductor cathode (cathode region) 305, the layers 302–305 being sequentially stacked on the substrate 301. The active layer 303 covers a part of a top surface of the anode layer 302. The first and second base layers 304 and 306 located on a top surface of the active layer 303 are separated from each other but in close proximity to each other. The cathode 305 covers a part of a top surface of the first base layer 304. An anode ohmic contact metal electrode 307 is provided on the top surface of the anode layer 302 in a position spaced from the active layer 303. A first base ohmic contact metal electrode 308 is provided on the top surface of the first base layer 304 in a position spaced from the cathode 305. Also, a cathode ohmic contact metal electrode 310 and a second base ohmic contact metal electrode 309 are provided on the cathode 305 and the second base layer 306, respectively. These electrodes 310 and 309 cover the greater part of the respective top surface of the cathode 305 and the base layer 306.

In this embodiment, the fourth terminal takes the form of a second base layer 306 located adjacent to the active layer 303 and in close proximity to the first base layer 304. A sub-harmonic locking signal applied to the second base layer 306 has the effect of stabilizing the Gunn oscillation (LO) signal frequency if the electric field generated by the signal penetrates far enough into the active layer 303 to disturb the electric field profile in the region in which Gunn oscillations are occurring. The arrows in FIG. 3 indicate the direction of flow of the electron flux. Since the lateral penetration distance of the electric field is approximately equal to the vertical penetration distance, the lateral separation distance between the second base region 306 and the cathode 305 should be less than twice the thickness of the active layer 303.

When the heterojunction bipolar transferred electron tetrode is used as a self-oscillating mixer in a receiver or transmitter, an input RF or IF signal is input into the cathode 305 through the cathode ohmic contact metal electrode 310 while the locking signal is input into the second base layer 306 through the second base ohmic contact metal electrode 309. Good electrical isolation between the second base terminal 309, 306 and the cathode terminal 310, 305 is achieved. Thus, the locking signal is prevented from being transmitted from the antenna of the receiver or transmitter in which the heterojunction bipolar transferred electron tetrode is included. In addition, because the lateral separation distance between the second base layer 306 and the cathode 305 is less than twice the thickness of the active layer 303, the injection locking signal well achieves the function of disturbing the electric field profile and the current density in the active layer 303. Thus, the Gunn oscillation (LO) signal frequency is effectively stabilized.

In the second embodiment, three or more base regions having their own electrodes may be formed adjacent to the active region. In this case two or more base regions may be located between the active region and the associated cathode regions.

Figure 4:
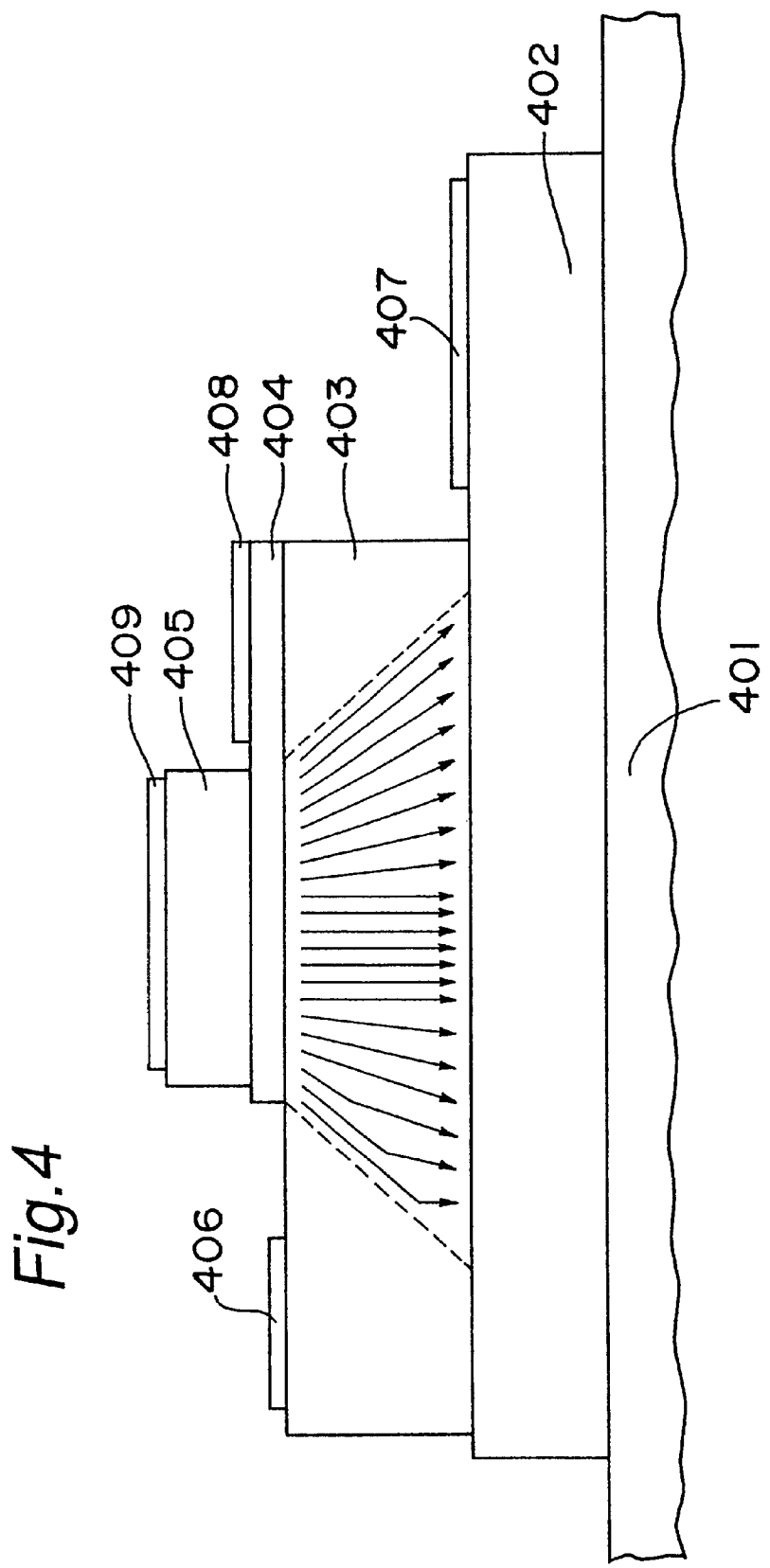
FIG. 4 shows a simplified schematic cross-section of a third embodiment of the heterojunction bipolar transferred electron tetrode of the invention.

FIG. 4 shows a simplified schematic cross-section of a third embodiment of the heterojunction bipolar transferred electron tetrode of the invention. The heterojunction bipolar transferred electron tetrode has a semi-insulating semiconductor substrate 401, an n-type semiconductor anode layer (anode region) 402, an n-type semiconductor active layer (active region) 403, a p-type semiconductor base layer (base region) 404, and an n-type semiconductor cathode (cathode region) 405, the layers 402–405 being sequentially stacked on the substrate 401. The active layer 403 covers a part of a top surface of the anode layer 402, the base layer 404 covers a part of a top surface of the active layer 403, and the cathode 405 covers a part of a top surface of the base layer 404. An anode ohmic contact metal electrode 407 is provided on the top surface of the anode layer 402 in a position spaced from the active layer 403. A Schottky barrier metal gate electrode 406 is provided on the top surface of the active layer 403 in a position spaced from the base layer 404. Also, a base ohmic contact metal electrode 408 is provided on the top surface of the base layer 404 in a position spaced from the cathode 405, and a cathode ohmic contact metal electrode 409 is provided on a top surface of the cathode 405, covering the greater part of the top surface.

In this embodiment, the fourth terminal has the form of a Schottky barrier metal gate electrode 406 located adjacent to the active layer 403 and in close proximity to the base layer 404. A sub-harmonic locking signal applied to the Schottky barrier metal gate electrode 406 has the effect of stabilizing the Gunn oscillation (LO) signal frequency if the electric field generated by the signal penetrates far enough into the active layer 403 to disturb the electric field profile in the region in which Gunn oscillations are occurring. The arrows in FIG. 4 indicate the direction of flow of the electron flux. The operation of the third embodiment is similar to that of the second embodiment with dual base regions and the lateral separation distance between the gate electrode 406 and the cathode 405 should be less than twice the thickness of the active layer 403.

When the heterojunction bipolar transferred electron tetrode is used as a self-oscillating mixer in a receiver or transmitter, an input (RF or IF) signal is input into the cathode 405 through the cathode ohmic contact metal electrode 409 while the locking signal is input into the Schottky barrier metal gate electrode 406. Good electrical isolation between the gate electrode 406 and the cathode terminal 409, 405 is achieved. Thus, the locking signal is prevented from being transmitted from an antenna of the receiver or transmitter in which the heterojunction bipolar transferred electron tetrode is included. In addition, because the lateral separation distance between the Schottky barrier metal gate electrode 406 and the cathode 405 is less than twice the thickness of the active layer 403, the injection locking signal applied to the gate electrode 406 well achieves the function of disturbing the electric field profile and the current density in the active layer 403. Thus, the Gunn oscillation (LO) signal frequency is effectively stabilized.

In the third embodiment, two or more base regions having their own electrodes may be disposed adjacent to the active region and two or more cathode regions also having their own electrodes may be formed on each of the base regions so that the base regions may be located between the active region and the cathode regions. Also, two or more Schottky barrier metal gate electrode may be disposed on the active region in close proximity to an associated cathode region.

In the above-described three major embodiments of the invention it is possible to interchange the input (RF or IF) terminal with the locking signal terminal. For example, in the first embodiment mentioned above, the input (RF or IF) signal would be applied to the second cathode 206 and the locking signal applied to the first cathode 205. In the second embodiment mentioned above, the input (RF or IF) signal would be applied to the second base terminal 306 and the locking signal applied to the cathode 305. In the third embodiment mentioned above, the input (RF or IF) signal would be applied to the Schottky barrier metal electrode 406 and the locking signal applied to the cathode 405.

Figure 1:
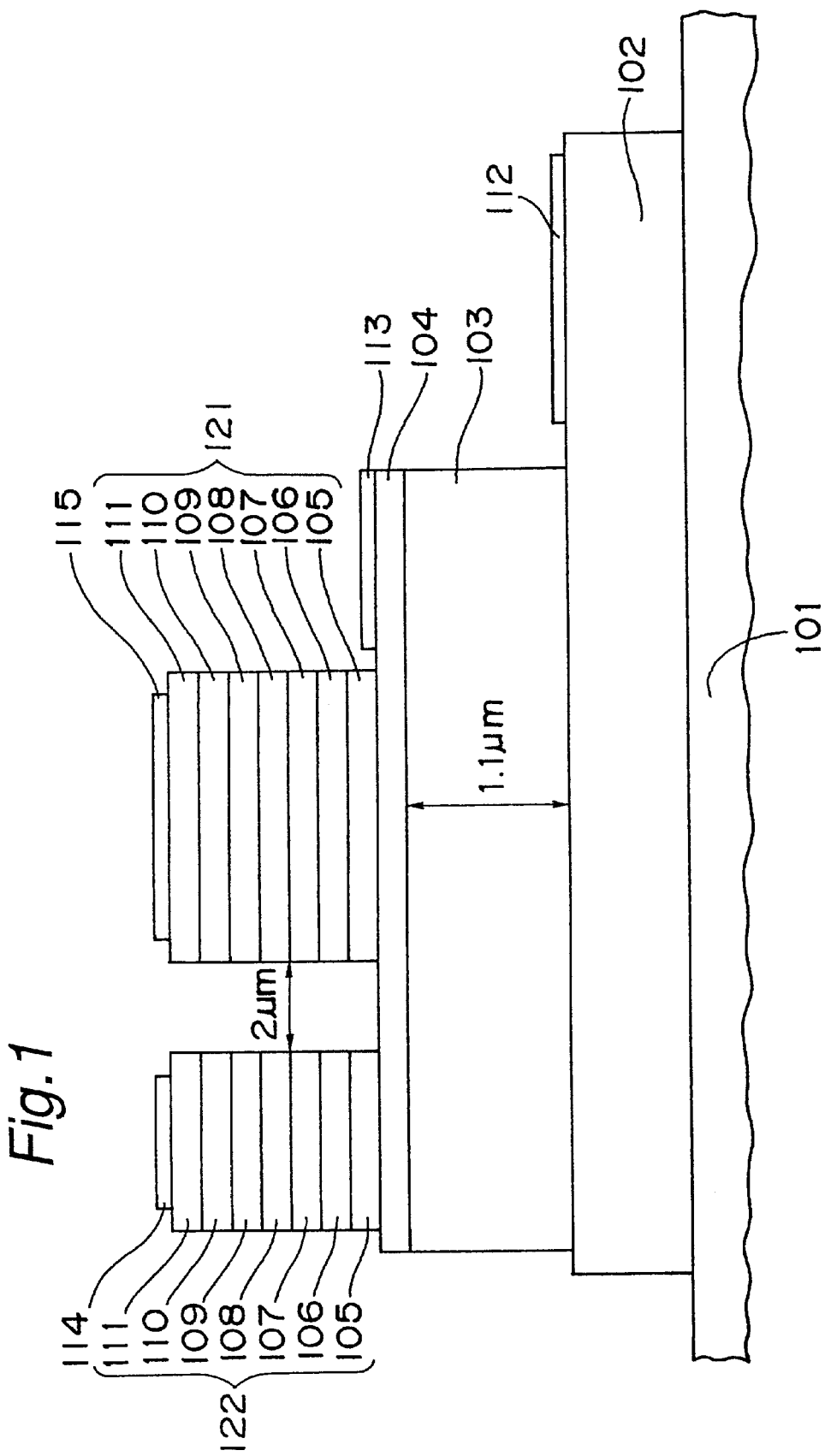
FIG. 1 shows a schematic cross-section of an example of a first embodiment of the heterojunction bipolar transferred electron tetrode of the invention.

FIG. 1 shows a schematic cross-section of one example of the above-mentioned first embodiment. The heterojunction bipolar transferred electron tetrode shown in this figure has sequentially, on a semi-insulating GaAs substrate 101: an n-type GaAs anode layer (500 nm, $N_D=5\times10^{18}$ cm$^{-3}$) 102, an n-type GaAs active layer (1100 nm, $N_D=1\times10^{16}$ cm$^{-3}\rightarrow3\times10^{16}$ cm$^{-3}$) 103 covering a part of a top surface of the anode layer 102, a p-type GaAs base layer (150 nm, $N_A-4\times10^{19}$ cm$^{-3}$) 104 covering an entire top surface of the active layer 103, and n-type semiconductor first and second cathodes 121 and 122. Note that symbols $N_D$ and $N_A$ represent the donor impurity doping concentration and the acceptor impurity doping concentration, respectively. Also, an arrow "$\rightarrow$" between two numerical values indicates a gradual change from one value to the other value as moving from the substrate side toward the device top surface side.

The first and second cathodes 121 and 122 have an identical lamination structure. Specifically, each cathode 121, 122 has sequentially, from the substrate 101 side, an n-type Al$_x$Ga$_{1-x}$As cathode graded layer (20 nm, $N_D=5\times10^{17}$ cm$^{-3}$, x=0.2$\rightarrow$0.35) 105, an n-type Al$_{0.35}$Ga$_{0.65}$As cathode layer (40 nm, $N_D=5\times10^{17}$ cm$^{-3}$) 106, an n-type Al$_{0.35}$Ga$_{0.65}$As cathode ballast layer (100 nm, $N_D=1\times10^{17}$ cm$^{-3}$) 107, an n-type Al$_x$Ga$_{1-x}$As ballast graded layer (50 nm, $N_D=5\times10^{17}$ cm$^{-3}$, x=0.35$\rightarrow$0.2), an n-type GaAs cap layer (100 nm, $N_D=5\times10^{18}$ cm$^{-3}$) 109, an n-type In$_x$Ga$_{1-x}$As cap graded layer (100 nm, $N_D=1\times10^{19}$ cm$^{-3}$, x=0.0$\rightarrow$0.5) 110, and an n-type In$_{0.5}$Ga$_{0.5}$As cap layer (100 nm, $N_D=1\times10^{19}$ cm$^{-3}$) 111.

An AuGe/Ni/Au anode ohmic contact electrode 112 is provided on the top surface of the anode layer 102 in a position spaced from the active layer 103, while a Ti/Pt/Au base ohmic contact electrode 113 is provided on the top surface of the base layer 104 in a position spaced from the cathodes 121 and 122. Also, a WN/Ti/Pt/Au first cathode ohmic contact electrode 115 and a WN/Ti/Pt/Au second cathode ohmic contact electrode 114 are provided on the first cathode 121 and the second cathode 122, respectively. These electrodes 115, 114 cover the greater part of the top surfaces of the cathodes 121, 122.

In this example, the fourth terminal has a second cathode-type structure 122 located adjacent to the base layer 104 in close proximity to the first cathode 121. The active layer 103 has a thickness of 1.1 $\mu$m and the lateral separation between the two cathodes 121 and 122 is 2 $\mu$m, as indicated in FIG. 1. That is, the lateral separation distance of the two cathodes 121 and 122 is less than twice the thickness of the active layer 103. Thus, a sub-harmonic locking signal applied to the cathode 122 or 121 has the effect of stabilizing the Gunn oscillation (LO) signal frequency.

Figure 5:
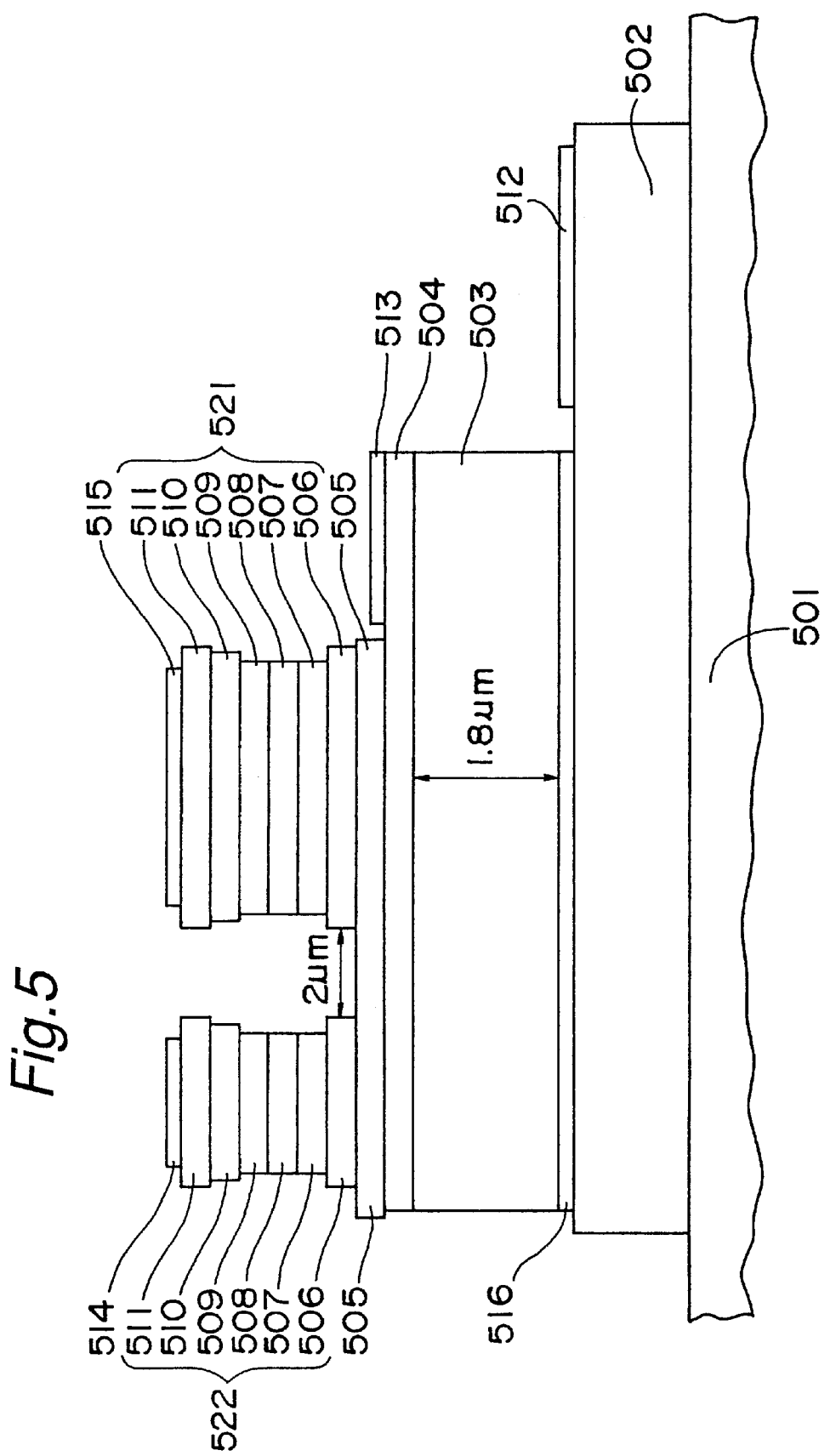
FIG. 5 shows a schematic cross-section of a modification of the FIG. 1 example.

FIG. 5 shows a schematic cross-section of a modification of the FIG. 1 example of the first embodiment. In the FIG. 5 example, the heterojunction bipolar transferred electron tetrode has sequentially, on a semi-insulating GaAs substrate 501: an n-type GaAs anode layer (500 nm, $N_D=5\times10^{18}$ cm$^{-3}$) 502, an n-type In$_{0.5}$Ga$_{0.5}$P anode layer (20 nm, $N_D=5\times10^{18}$ cm$^{-3}$) 516 covering a part of a top surface of the anode layer 502, an n-type GaAs active layer (1800 nm, $N_D=1\times10^{16}$ cm$^{-3}\rightarrow3\times10^{16}$ cm$^{-3}$) 503 covering the entire top surface of the anode layer 516, a p-type GaAs base layer (150 nm, $N_A=4\times10^{19}$ cm$^{-3}$) 504 covering the entire top surface of the active layer 503, an n-type In$_{0.5}$Ga$_{0.5}$P passivation layer (30 nm, $N_D=5\times10^{17}$ cm$^{-3}$) 505 covering a part of a top surface of the base layer 504, and n-type semiconductor first and second cathodes 521 and 522 separated from each other but in close proximity to each other.

The first and second laminated cathodes 521 and 522 have the same lamination structure. Specifically, each laminated cathode 521, 522 has sequentially, from the substrate 501 side, an n-type Al$_x$Ga$_{1-x}$As cathode graded layer (40 nm, $N_D=5\times10^{17}$ cm$^{-3}$, x=0.2$\rightarrow$0.35) 506, an n-type Al$_{0.35}$Ga$_{0.65}$As cathode ballast layer (100 nm, $N_D=1\times10^{17}$ cm$^{-3}$) 507, an n-type Al$_x$Ga$_{1-x}$As ballast graded layer (50 nm, $N_D=5\times10^{17}$ cm$^{-3}$, x=0.35$\rightarrow$0.2) 508, an n-type GaAs cap layer (100 nm, $N_D=5\times10^{18}$ cm$^{-3}$) 509, an n-type In$_x$Ga$_{1-x}$ As cap graded layer (100 nm, $N_D=1\times10^{19}$ cm$^{-3}$, x=0.0$\rightarrow$0.5) 510, and an n-type In$_{0.5}$Ga$_{0.5}$As cap layer (100 nm, $N_D=1\times10^{19}$ cm$^{-3}$) 511.

An AuGe/Ni/Au anode ohmic contact electrode 512 is provided on the top surface of the anode layer 502 in a position spaced from the active layer 503. A Ti/Pt/Au base ohmic contact electrode 513 is provided on the top surface of the base layer 504 in a position spaced from the cathodes 521 and 522. Also, a WN/Ti/Pt/Au first cathode ohmic contact electrode 515 and a WN/Ti/Pt/Au second cathode ohmic contact electrode 514 are provided on the first laminated cathode 521 and the second laminated cathode 522, respectively.

In this example the InGaP passivation layer 505 is included in the device structure. Since the InGaP layer 505 is depleted of electrons, the cathodes 521 and 522 are electrically isolated from each other. As indicated in FIG. 5, the active layer 503 has a thickness of 1.8 $\mu$m and the minimum lateral separation distance between the two cathodes is 2 $\mu$m. That is, the lateral separation distance of the two cathodes 521 and 522 is less than twice the thickness of the active layer 503. Thus, a sub-harmonic locking signal applied to the cathode 522 or 521 has the effect of stabilizing the Gunn oscillation (LO) signal frequency.

Figure 6:
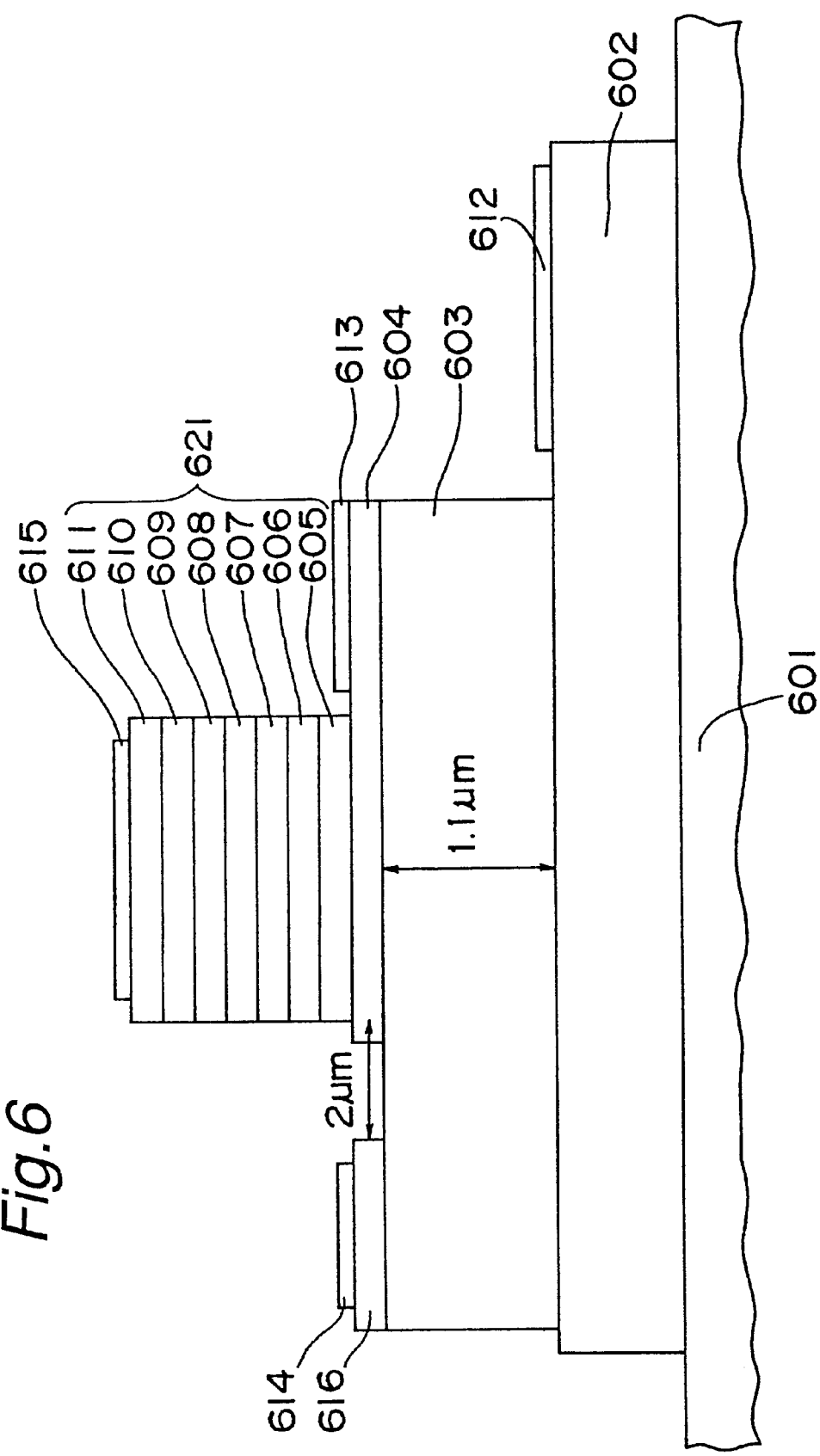
FIG. 6 shows a schematic cross-section of an example of the second embodiment of the heterojunction bipolar transferred electron tetrode of the invention.

FIG. 6 shows a schematic cross-section of an example of the device structure according to the second embodiment. In the FIG. 6 example, the heterojunction bipolar transferred electron tetrode has sequentially, on a semi-insulating GaAs substrate 601: an n-type GaAs anode layer (500 nm, $N_D$=5×$10^{18}$ cm$^{-3}$) 602, an n-type GaAs active layer (1100 nm, $N_D$=1×$10^{16}$ cm$^{-3}$→3×$10^{16}$ cm$^{-3}$) 603 covering a part of a top surface of the anode layer 602, p-type GaAs first and second base layers (150 nm, $N_A$=4×$10^{19}$ cm$^{-3}$) 604 and 616 spaced from each other but in close proximity to each other on the active layer 603, and an n-type semiconductor cathode 621 covering a part of a top surface of the first base layer 604.

The cathode 621 has sequentially, from the substrate 601 side, an n-type Al$_x$Ga$_{1-x}$As cathode graded layer (20 nm, $N_D$=5×$10^{17}$ cm$^{-3}$, x=0.2→0.35) 605, an n-type Al$_{0.35}$Ga$_{0.65}$As cathode layer (40 nm, $N_D$=5×$10^{17}$ cm$^{-3}$) 606, an n-type Al$_{0.35}$Ga$_{0.65}$As cathode ballast layer (100 nm, $N_D$=1×$10^{17}$ cm$^{-3}$) 607, an n-type Al$_x$Ga$_{1-x}$As ballast graded layer (50 nm, $N_D$=5×$10^{17}$ cm$^{-3}$, x=0.35→0.2) 608, an n-type GaAs cap layer (100 nm, $N_D$=5×$10^{18}$ cm$^{-3}$) 609, an n-type In$_x$Ga$_{1-x}$As cap graded layer (100 nm, $N_D$=1×$10^{19}$ cm$^{-3}$, x=0.0→0.5) 610, and an n-type In$_{0.5}$Ga$_{0.5}$As cap layer (100 nm, $N_D$=1×$10^{19}$ cm$^{-3}$) 611.

An AuGe/Ni/Au anode ohmic contact electrode 612 is provided on the top surface of the anode layer 602 in a position spaced from the active layer 603. A Ti/Pt/Au first base ohmic contact electrode 613 is provided on the top surface of the first base layer 604 in a position spaced from the cathode 621. Also, a WN/Ti/Pt/Au cathode ohmic contact electrode 615 and a Ti/Pt/Au second base ohmic contact electrode 614 are provided on the top surfaces of the cathode 621 and of the second base layer 616, respectively.

In the FIG. 6 example, the fourth terminal has the form of a second base layer 616 located adjacent to the active layer 603 in close proximity to the first base layer 604. The active layer 603 has a thickness of 1.1 μm and the lateral separation between the cathode 621 and the second base region 616 is 2 μm, as indicated in the figure. That is, the lateral separation distance of the cathode 621 and the second base region 616 is less than twice the thickness of the active layer 603. Thus, a sub-harmonic locking signal applied to the second base layer 616 or cathode 621 has the effect of stabilizing the Gunn oscillation (LO) signal frequency.

Figure 7:
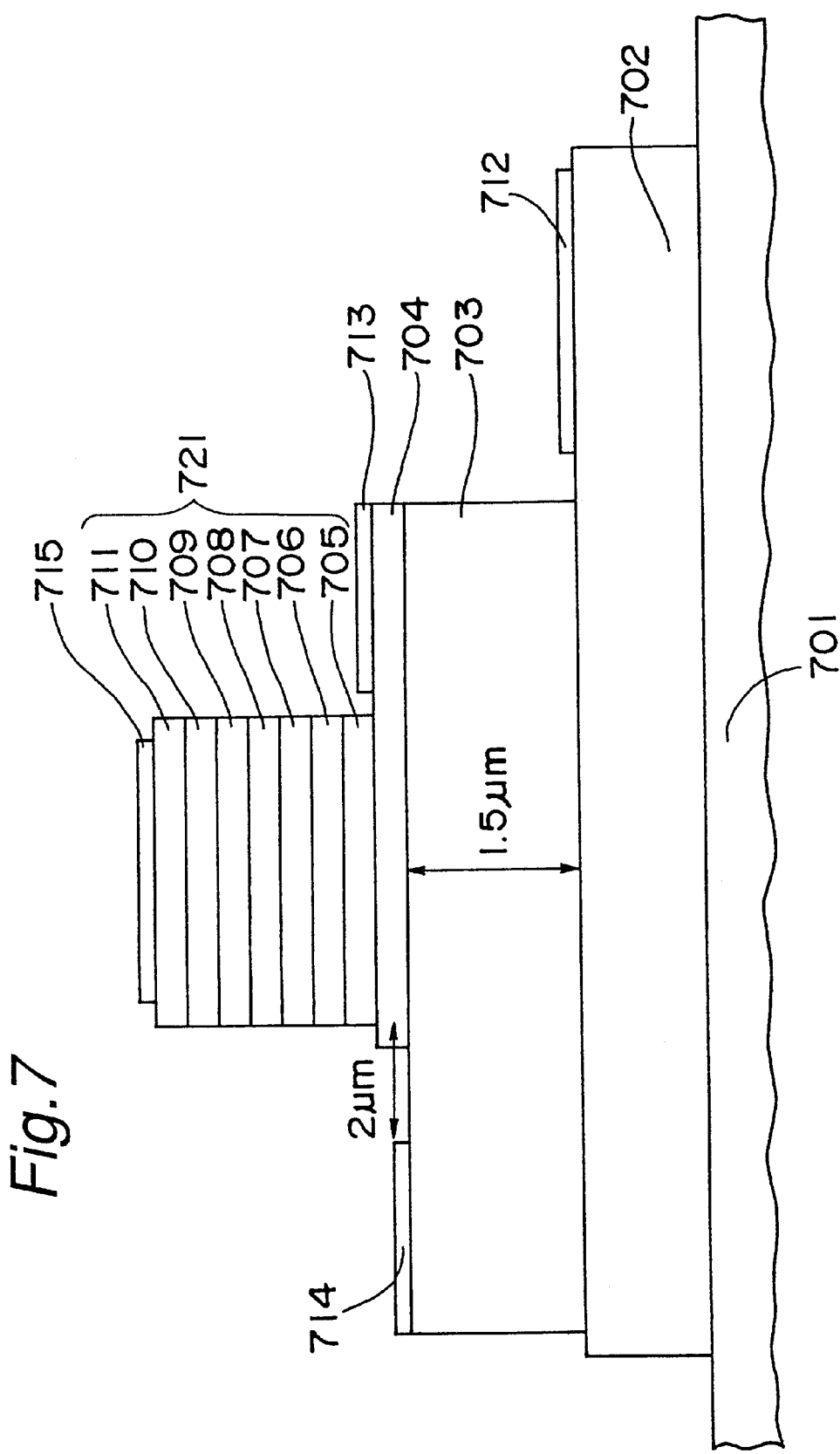
FIG. 7 shows a schematic cross-section of an example of the third embodiment of the heterojunction bipolar transferred electron tetrode of the invention.
Figure 8:
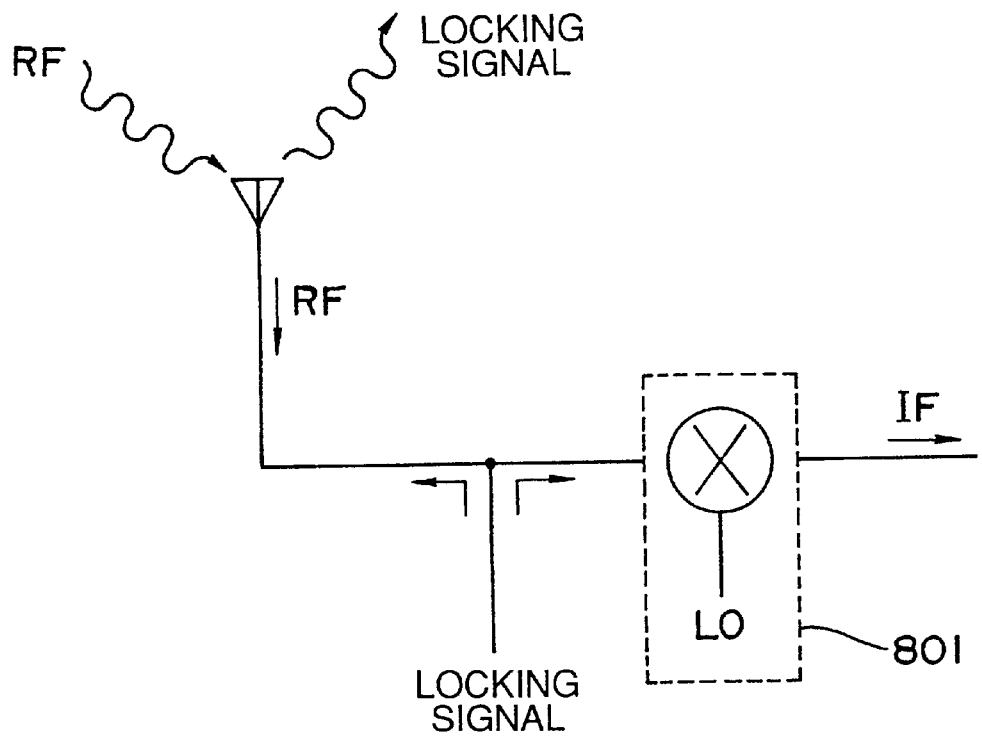
FIG. 8 shows a schematic of a conventional heterojunction bipolar transferred electron triode used in a receiver as a self-oscillating mixer.

FIG. 7 shows a schematic cross-section of an example of the device structure of the heterojunction bipolar transferred electron tetrode according to the third embodiment. In this example, the heterojunction bipolar transferred electron tetrode has sequentially, on a semi-insulating GaAs substrate 701: an n-type GaAs anode layer (500 nm, $N_D$=5×$10^{18}$ cm$^{-3}$) 702, an n-type GaAs active layer (1500 nm, $N_D$=1×$10^{16}$ cm$^{-3}$→3×$10^{16}$ cm$^{-3}$) 703 covering a part of a top surface of the anode layer 702, a p-type GaAs base layer (150 nm, $N_A$=4×$10^{19}$ cm$^{-3}$) 704 covering a part of a top surface of the active layer 703, and an n-type semiconductor cathode 721 covering a part of a top surface of the base layer 704.

The cathode 721 has sequentially, from the substrate 701 side, an n-type Al$_x$Ga$_{1-x}$As cathode graded layer (20 nm, $N_D$=5×$10^{17}$ cm$^{-3}$, x=0.2→0.35) 705, an n-type Al$_{0.35}$Ga$_{0.65}$As cathode layer (40 nm, $N_D$=5×$10^{17}$ cm$^{-3}$) 706, an n-type Al$_{0.35}$Ga$_{0.65}$As cathode ballast layer (100 nm, $N_D$=1×$10^{17}$ cm$^{-3}$) 707, an n-type Al$_x$Ga$_{1-x}$As ballast graded layer (50 nm, $N_D$=5×$10^{17}$ cm$^{-3}$, x=0.35→0.2) 708, an n-type GaAs cap layer (100 nm, $N_D$=5×$10^{18}$ cm$^{-3}$) 709, an n-type In$_x$Ga$_{1-x}$As cap graded layer (100 nm, $N_D$=1×$10^{19}$ cm$^{-3}$, x=0.0→0.5) 710, and an n-type In$_{0.5}$Ga$_{0.5}$As cap layer (100 nm, $N_D$=1×$10^{19}$ cm$^{-3}$) 711.

An AuGe/Ni/Au anode ohmic contact electrode 712 is provided on the top surface of the anode layer 702 in a position spaced from the active layer 703. A Schottky barrier gate electrode 714 is provided on the active layer 703 in a separated manner from but in close proximity to the base layer 704. A Ti/Pt/Au base ohmic contact electrode 713 is provided on the top surface of the base layer 704 in a position spaced from the cathode 721. Also, a WN/Ti/Pt/Au cathode ohmic contact electrode 715 is provided on the top surface of the cathode 721.

In this embodiment the fourth terminal has the form of a Schottky barrier gate electrode 714 located adjacent to the active layer 703 in close proximity to the base region 704. The active layer 703 has a thickness of 1.5 μm and the lateral separation between the cathode 721 and the Schottky barrier gate electrode 714 is 2 μm, as indicated in FIG. 7. That is, the minimum lateral separation distance of the cathode 721 and the gate electrode 714 is less than twice the thickness of the active layer 703. Thus, a sub-harmonic locking signal applied to the Schottky barrier gate electrode 714 or the cathode 721 has the effect of stabilizing the Gunn oscillation (LO) signal frequency.

Figure 9:
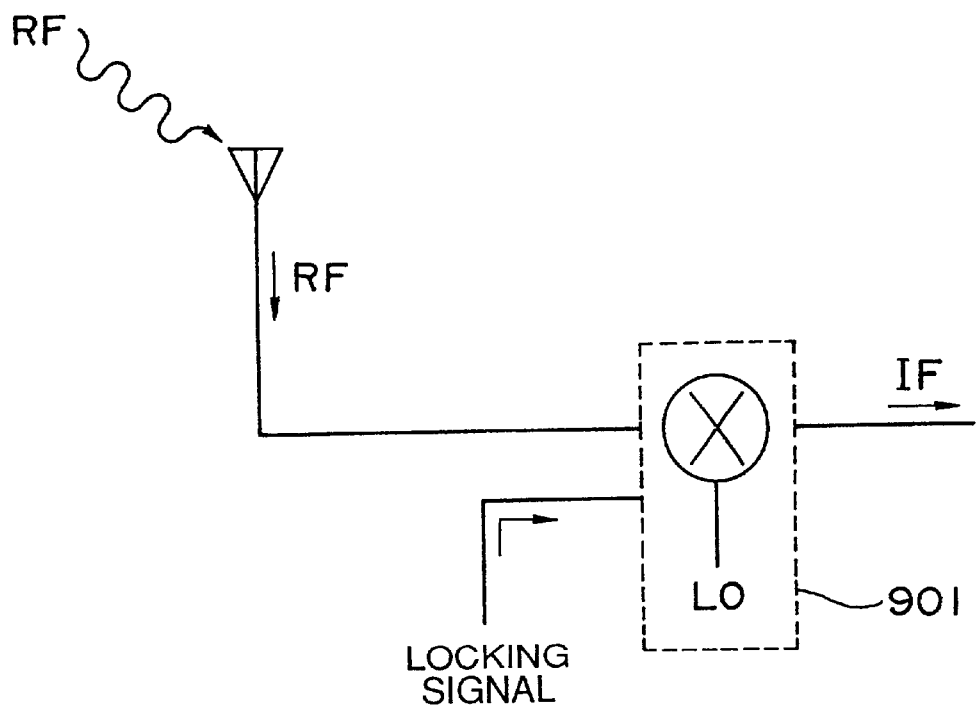
FIG. 9 shows a schematic of the heterojunction bipolar transferred electron tetrode of this invention used in a receiver as a self-oscillating mixer.

As compared with the conventional heterojunction bipolar triode, the heterojunction bipolar transferred electron tetrode in any one of the above-mentioned embodiments has good electrical isolation between the injection-locking signal and the input (RF or IF) signal when used in a receiver, as shown in FIG. 9, as a self-oscillating mixer 901. The high degree of electrical isolation arises because of the high impedance between the input (RF or IF) terminal and the terminal into which the locking signal is applied. This isolation between the input terminal and the locking signal terminal prevents the unwanted transmission of the locking signal from the antenna in the receiver.

Figure 10:
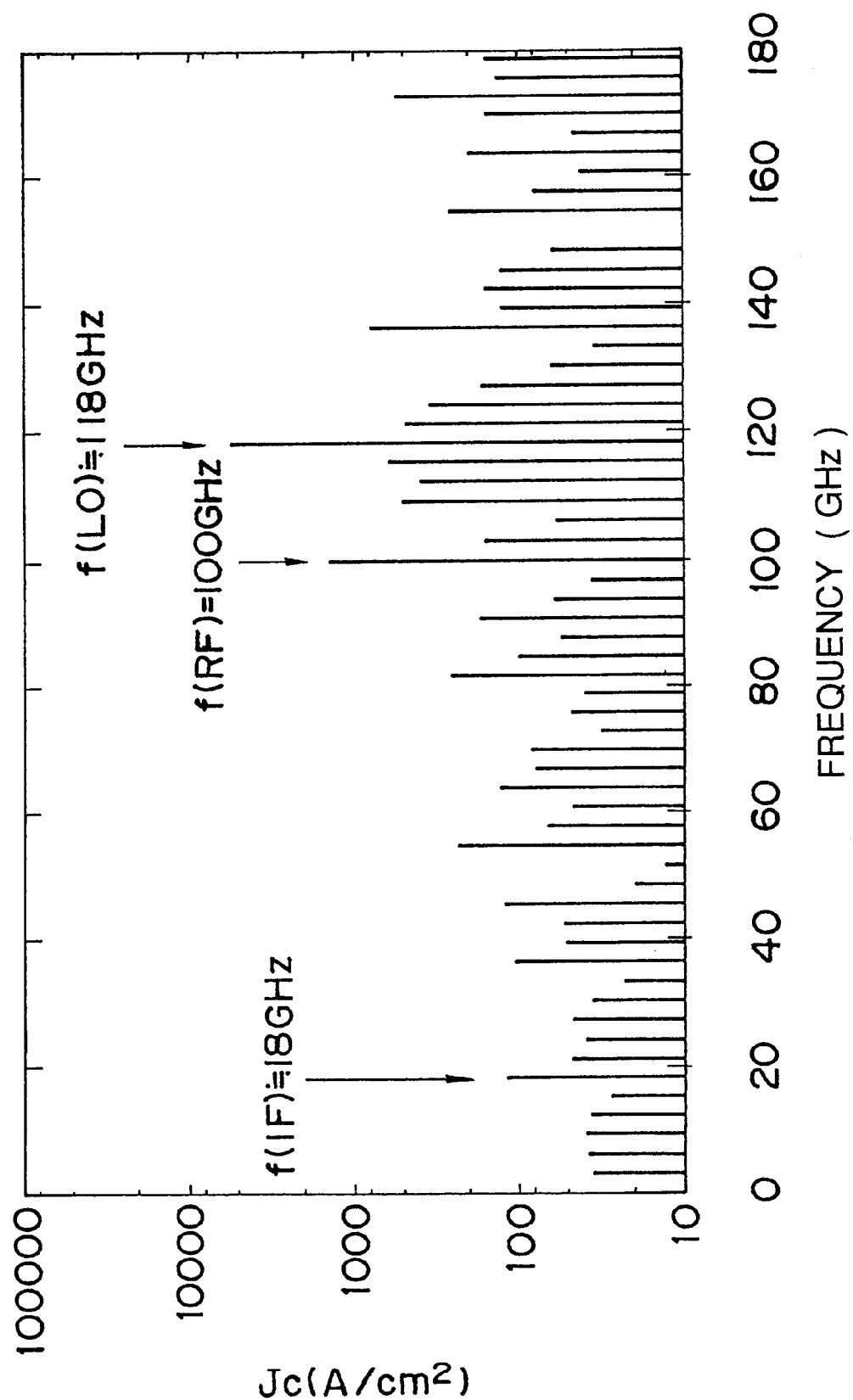
FIG. 10 shows a simulated output spectrum of a heterojunction bipolar transferred electron tetrode of the type shown in FIG. 1 with dual cathode terminals in the free-running mode.
Figure 11:
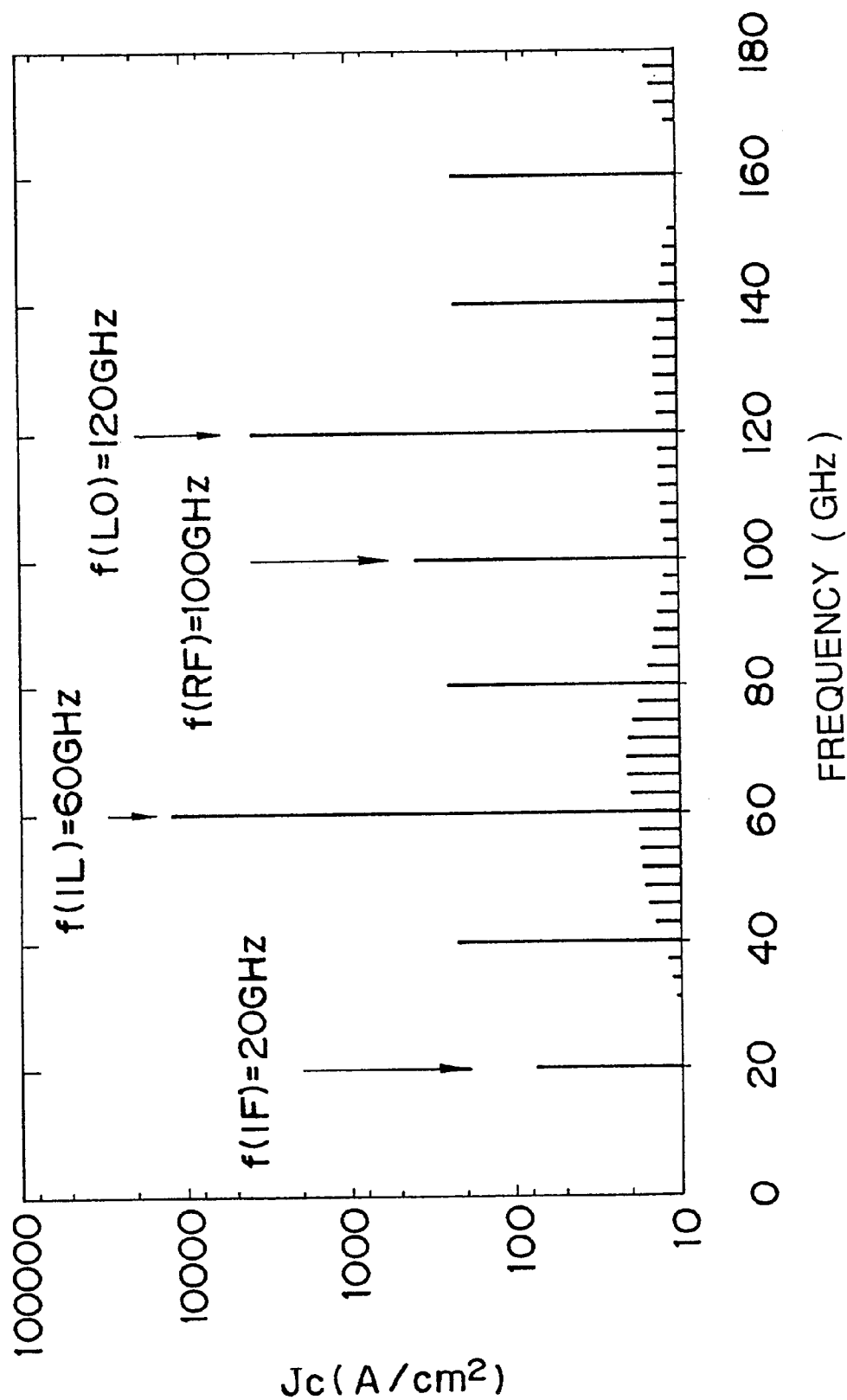
FIG. 11 shows a simulated output spectrum of a heterojunction bipolar transferred electron tetrode of the type shown in FIG. 1 in the injection-locked mode.
Figure 12:
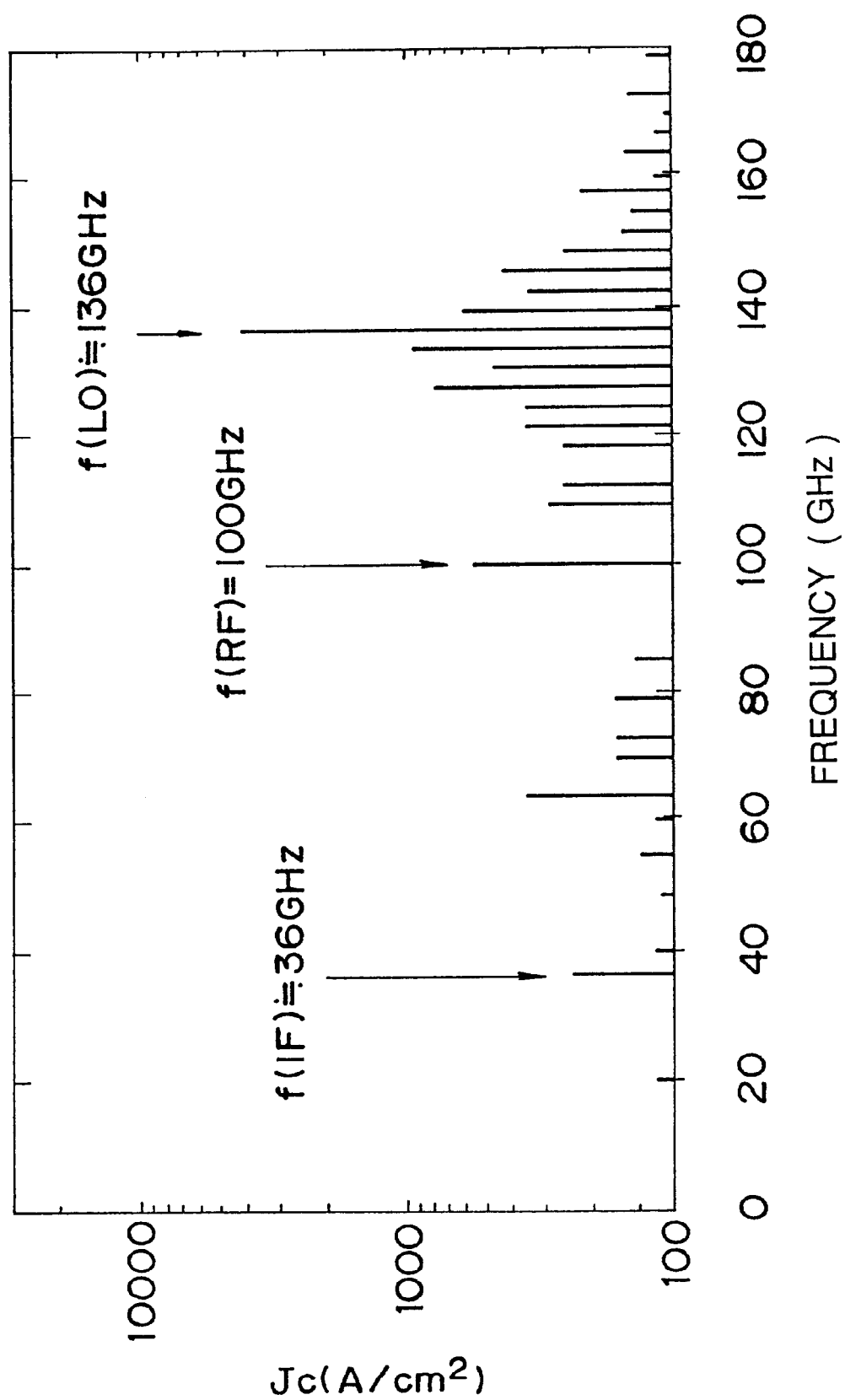
FIG. 12 shows a simulated output spectrum of a heterojunction bipolar transferred electron tetrode of the type shown in FIG. 6 with dual base terminals in the free-running mode.
Figure 13:
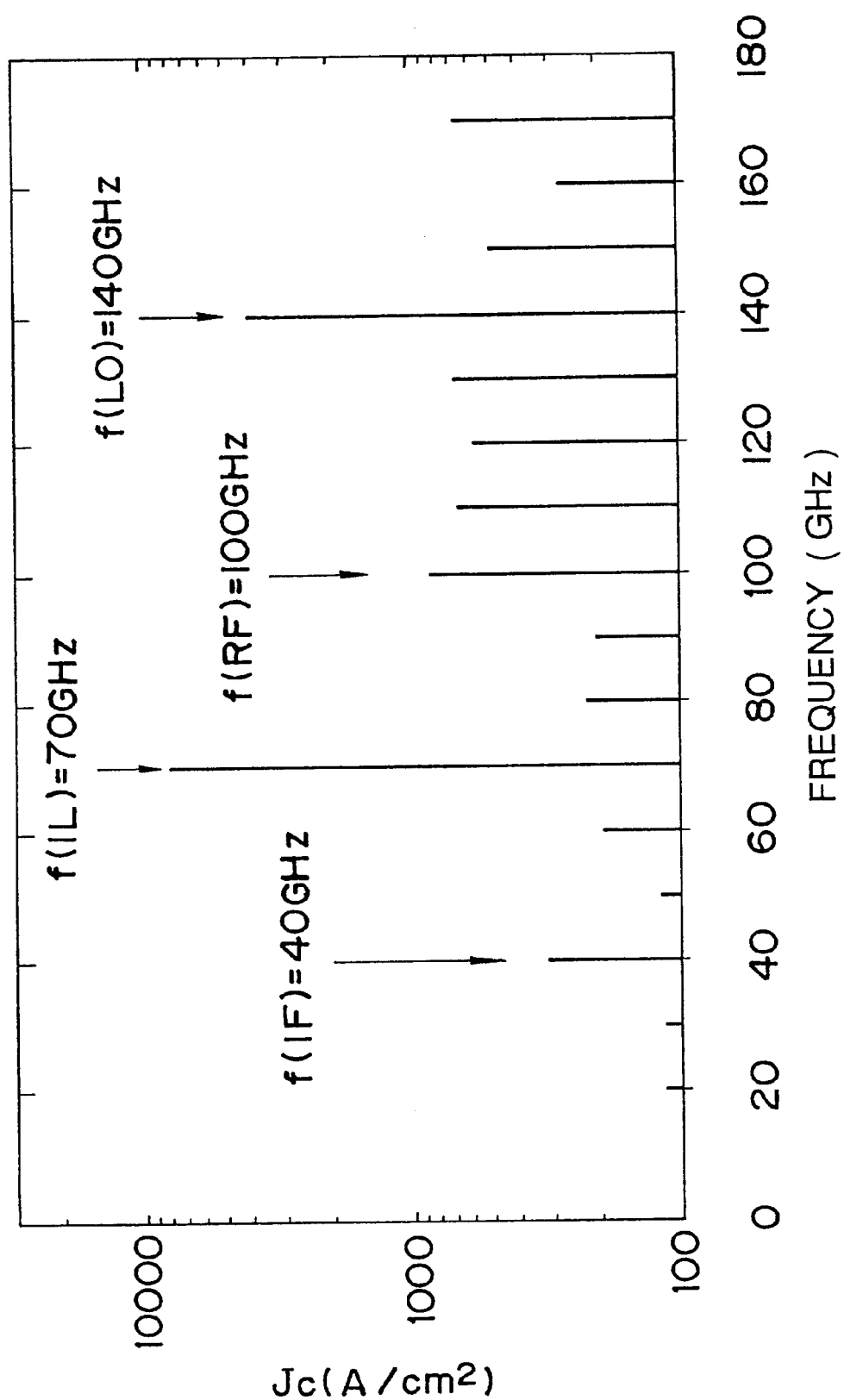
FIG. 13 shows a simulated output spectrum of a heterojunction bipolar transferred electron tetrode of the type shown in FIG. 6 in the injection-locked mode.

Two-dimensional device simulations have been carried out to test the effectiveness of applying a locking signal to the fourth terminal of the heterojunction bipolar transferred electron tetrode. These simulations show that a heterojunction bipolar transferred electron tetrode can be successfully operated as a self-oscillating mixer in the down converter or up converter mode, with the LO signal frequency stabilized by the locking signal applied to the fourth terminal. FIGS. 10 and 11 show the simulated output spectrum of a heterojunction bipolar transferred electron tetrode of the type shown in FIG. 1 with dual cathode terminals, where the active layer thickness is 1 μm and the cathode separation is 1 μm. The spectrum shown in FIG. 10 was obtained for the free-running mode (i.e. with no locking signal applied to the second cathode). The RF input frequency f(RF) is 100 GHz and the free-running LO oscillation frequency f(LO) is about 118 GHz. An IF signal at a frequency f(IF) of about 18 GHz is obtained. The spectrum shown in FIG. 11 was obtained for the same device in the injection locked mode, with a 60 GHz (f(IL)) locking signal applied to the second cathode. The LO frequency is successfully stabilized at 120 GHz (twice the locking frequency) and an IF signal at a frequency of 20 GHz is obtained. FIGS. 12 and 13 show the simulated output spectrum of a heterojunction bipolar transferred electron tetrode of the type shown in FIG. 6 with dual base terminals, where the active layer thickness is 1 μm and the second base/cathode separation is 1 μm. The spectrum shown in FIG. 12 was obtained for the free-running mode (i.e. with no locking signal applied to the second base). The RF input frequency is 100 GHz and the free-running LO oscillation frequency is about 136 GHz. An IF signal at a frequency of about 36 GHz is obtained. The spectrum shown in FIG. 13 was obtained for the same device in the injection locked mode, with a 70 GHz locking signal applied to the second base. The LO frequency is successfully stabilized at 140

GHz (twice the locking frequency) and an IF signal at a frequency of 40 GHz is obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heterojunction bipolar transferred electron tetrode comprising:
   an anode region providing a first terminal as an output terminal;
   an active region in which Gunn-Hilsum oscillations are generated;
   a base region providing a second terminal;
   a cathode region providing a third terminal;
   said anode region, active region, base region, and cathode region being provided sequentially, and
   a fourth terminal which is operable independently of each of said three terminals, and wherein
      said cathode region and fourth terminal are in proximity enough to each other such that one of said cathode region and said fourth terminal is usable as an input terminal and that the other of said cathode region and said fourth terminal is usable as a terminal to which an electrical signal for disturbing at least one of an electric field profile and a current density in the active region is applied.

2. The heterojunction bipolar transferred electron tetrode according to claim 1, wherein a minimum distance between said cathode region and said fourth terminal in a direction parallel to a plane of an interface between said base region and said active region is less than twice a thickness of said active region in a direction perpendicular to said plane.

3. The heterojunction bipolar transferred electron tetrode according to claim 1, wherein said anode region, active region, and cathode region are made of n-type semiconductors and said base region is made of a p-type semiconductor.

4. The heterojunction bipolar transferred electron tetrode according to claim 1, wherein
   said fourth terminal is constituted of a second cathode region;
   each cathode region is located adjacent to said base region and has its own independent electrode;
   materials of said cathode regions, base region, active region and anode region are III–V semiconductor compounds containing one or more of group III elements of Ga, In or Al and one or more of group V elements of As, P or N; and
   said active region has a doping concentration $N_D$ that decreases with increasing distance from an interface between said active region and said base region.

5. The heterojunction bipolar transferred electron tetrode according to claim 4, further comprising a mobile charge-depleted layer between said base region and said cathodes.

6. The heterojunction bipolar transferred electron tetrode according to claim 1, wherein
   said fourth terminal is constituted of a second base region;
   each base region is located adjacent to said active region and has its own independent electrode;
   materials of said cathode region, base regions, active region and anode region are III–V semiconductor compounds containing one or more of group III elements of Ga, In and Al and one or more of group V elements of As, P and N; and
   said active region has a doping concentration that decreases with increasing distance from an interface between said active region and said base region.

7. The heterojunction bipolar transferred electron tetrode according to claim 1, wherein
   said fourth terminal is constituted of a Schottky barrier gate electrode formed on said active layer;
   materials of said cathode region, base region, active region and anode region are III–V semiconductor compounds containing one or more of group III elements of Ga, In and Al and one or more of group V elements of As, P and N; and
   said active region has a doping concentration that decreases with increasing distance from an interface between said active region and said base region.

8. A heterojunction bipolar transferred electron tetrode comprising:
   an n-type semiconductor anode region;
   an n-type semiconductor active region;
   a p-type semiconductor base region; and
   a plurality of n-type semiconductor cathode regions, and wherein
      each cathode region is located adjacent to the base region and has its own independent electrode;
      materials of the cathode regions, base region, active region and anode region are III–V semiconductor compounds containing one or more of group III elements Ga, In and Al and one or more of group V elements As, P and N; and
      the active region has a doping concentration $N_D$ that decreases with increasing distance from an interface of the base region and the active region.

9. The heterojunction bipolar transferred electron tetrode according to claim 8, in which:
   a minimum distance between adjacent cathode regions in a direction parallel to a plane of the interface between the base region and the active region is less than twice a thickness of the active region in a direction perpendicular to the plane of the interface between the base and the active region.

10. A heterojunction bipolar transferred electron tetrode, comprising:
    an n-type semiconductor anode region;
    an n-type semiconductor active region;
    a plurality of p-type semiconductor base regions; and
    at least one n-type semiconductor cathode region, and wherein
       each base region is located adjacent to the active region and has its own independent electrode;
       at least one base region is located between the active region and the cathode region;
       materials of the cathode regions, base region, active region and anode region are III–V semiconductor compounds containing one or more of group III elements Ga, In and Al and one or more of group V elements As, P and N; and
       the active region has a doping concentration $N_D$ that decreases with increasing distance from an interface of the base region and the active region.

11. The heterojunction bipolar transferred electron tetrode according to claim 10, in which:
    a minimum distance between said second base region and said cathode region in a direction parallel to a plane of the interface between the base region and the active region is less than twice a thickness of the active layer in a direction perpendicular to the plane of the interface between the base region and the active region.

12. A heterojunction bipolar transferred electron tetrode, comprising:

an n-type semiconductor anode region;

an n-type semiconductor active region;

at least one p-type semiconductor base region;

at least one n-type semiconductor cathode region; and wherein at least one Schottky barrier gate electrode is formed on the active layer;

each base region is located adjacent to the active region and has its own independent electrode;

at least one base region is located between the active region and the cathode region;

materials of the cathode region, base region, active region, and anode region are III–V semiconductor compounds containing one or more of group III elements Ga, In and Al and one or more of group V elements As, P and N; and the active region has a doping concentration $N_D$ that decreases with increasing distance from an interface of the base region and the active region.

13. The heterojunction bipolar transferred electron tetrode according to claim 12, in which:

a minimum distance between the Schottky barrier gate electrode and the adjacent cathode region in a direction parallel to a plane of the interface between the base and the active region is less than twice a thickness of the active layer in a direction perpendicular to the plane of the interface between the base and the active region.

* * * * *